United States Patent
Lorg et al.

(10) Patent No.: US 8,520,564 B1
(45) Date of Patent: Aug. 27, 2013

(54) INTEGRATED RF TRANSCEIVER

(75) Inventors: Shawn M. Lorg, Chandler, AZ (US);
Kenneth V. Buer, Gilbert, AZ (US);
Ramana Darapu, Gilbert, AZ (US);
Nitin Jain, San Diego, CA (US)

(73) Assignee: ViaSat, Inc., Carlsbad, CA (US)

( * ) Notice: Subject to any disclaimer, the term of this patent is extended or adjusted under 35 U.S.C. 154(b) by 144 days.

(21) Appl. No.: 13/224,798

(22) Filed: Sep. 2, 2011

Related U.S. Application Data

(60) Provisional application No. 61/379,620, filed on Sep. 2, 2010.

(51) Int. Cl.
*H04B 1/44* (2006.01)

(52) U.S. Cl.
USPC .......................................... 370/282

(58) Field of Classification Search
None
See application file for complete search history.

(56) References Cited

U.S. PATENT DOCUMENTS

| | | | |
|---|---|---|---|
| 6,697,606 B1* | 2/2004 | Wagemans et al. | 455/86 |
| 6,754,508 B1* | 6/2004 | Pau | 455/552.1 |
| 2002/0183033 A1* | 12/2002 | Gu et al. | 455/302 |
| 2003/0003860 A1* | 1/2003 | Dwornik | 455/3.01 |
| 2003/0114128 A1* | 6/2003 | Haapoja et al. | 455/307 |
| 2005/0281320 A1* | 12/2005 | Neugebauer | 375/141 |
| 2007/0264942 A1* | 11/2007 | Wu | 455/73 |
| 2010/0091688 A1* | 4/2010 | Staszewski et al. | 370/277 |
| 2010/0283654 A1* | 11/2010 | Waheed et al. | 341/166 |
| 2011/0235572 A1* | 9/2011 | Lorg et al. | 370/316 |
| 2011/0285912 A1* | 11/2011 | Zhou et al. | 348/660 |
| 2011/0300914 A1* | 12/2011 | Gudem et al. | 455/574 |
| 2012/0077447 A1* | 3/2012 | Rofougaran | 455/73 |
| 2013/0063324 A1* | 3/2013 | Rofougaran | 343/861 |

* cited by examiner

*Primary Examiner* — Otis L Thompson, Jr.
(74) *Attorney, Agent, or Firm* — Snell & Wilmer L.L.P.

(57) ABSTRACT

The present disclosure includes an integrated full-duplex transceiver, which may be implemented on a single substrate or die. A single substrate may in turn, comprise, an I/O port configured for full-duplex operation, a transmit portion and a receive portion, a first mixer for up-converting a transmit signal, a second mixer for down-converting a receive signal, a first independently tunable local oscillator that drives the first mixer, and a second independently tunable local oscillator that drives the second mixer. The first independently tunable oscillator may facilitate up-conversion of a transmit IF signal, while a second independently tunable oscillator may facilitate down-conversion of a receive RF signal.

18 Claims, 3 Drawing Sheets

INTEGRATED RF TRANSCEIVER

CROSS REFERENCE TO RELATED APPLICATIONS

This application claims the benefit of U.S. Provisional Application No. 61/379,620, filed Sep. 2, 2010 and entitled "INTEGRATED RF TRANSCEIVER."

BACKGROUND OF THE INVENTION

State of the art transceiver products are often made by assembling a number of discrete components on one or more printed circuit boards. Where this is the case, the circuitry may be quite flexible and capable of accommodating a variety of configurations and features. Such transceiver systems are hampered, however, by the fact that manufacture on a variety of disparate printed circuit boards increases the size and mass of the system. Moreover, such distributed systems typically introduce large delays, because during operation the signals must travel over large areas.

In view of these disadvantages, some transceiver manufacturers have attempted to build integrated transceiver systems. In these systems, a single integrated circuit may accommodate a variety of components. Thus, integrated transceiver systems offer an advantage in size and weight over disparate, non-integrated systems. Moreover, integrated transceiver systems offer an advantage in that shorter delays are introduced, because the traces or paths that each signal must travel are shorter.

Integrated systems, however, face serious disadvantages as well. These disadvantages are a result, in large part, of the close proximity of signal paths to one another. That is, as circuitry is packed closer together, integrated systems experience cross-talk and interference, particularly where signals are in a same or similar frequency range. Interference may ultimately render defective or at least unreliable an integrated transceiver system. Thus, integrated transceiver designers are limited, by space constraints, to a selection of perhaps fewer than all of the components available on more traditional non-integrated systems. Moreover, interference concerns require further design concessions. As an example, many current integrated transceiver systems are only tunable to a single frequency band which must be manually programmed at the time of manufacture. Likewise, modern integrated transceivers are often unable to automatically vary their gain. Rather, gain is most often tuned, and set permanently, at the time of manufacture. Modern integrated transceiver products also typically have no facility for reporting telemetry data and rely for communication upon separate transmit and receive ports. Indeed, most modern integrated transceiver systems operate in a half-duplex mode. Finally, most integrated transceiver systems available today, although they may perform some form of temperature compensation, are limited to compensating for internal changes in temperature. That is, prior art systems do not compensate for temperature changes that occur externally, e.g., at an amplifier coupled to the transceiver.

SUMMARY

The present disclosure includes an integrated full-duplex transceiver. An integrated transceiver may comprise a single substrate, which may, in turn, comprise, an I/O port configured for full-duplex operation, a transmit portion and a receive portion, a first mixer for up-converting a transmit signal, a second mixer for down-converting a receive signal, a first independently tunable local oscillator that drives the first mixer, and a second independently tunable local oscillator that drives the second mixer. Each independently tunable oscillator may be automatically retuned during operation. This may be accomplished by way of a plurality of counter registers, which are loaded by way of a bus line and programmed using at least one mixer. The first independently tunable oscillator may facilitate up-conversion of a transmit IF signal, while a second independently tunable oscillator may facilitate down-conversion of a receive RF signal.

In various embodiments, a transceiver may further comprise a multiplexer and demultiplexer, which receives a plurality of signals. A transceiver may further comprise a variable gain amplifier ("VGA"). A gain associated with the VGA may, in various embodiments, depend upon a signal generated by a temperature controlled resistor and/or a thermistor. A gain of the VGA may be adjusted in response to a temperature external to the transceiver and/or a temperature internal to the transceiver. A transceiver may also comprise a gain adjustment that adjusts a gain of the transceiver and/or an off-chip amplifier in response to a reading provided by a temperature sensor.

Further, in various embodiments, an integrated transceiver may comprise an injection switchable image reject mixer ("IRM") that filters a desired image of a received intermediate frequency ("IF") signal as well as an internal low-dropout regulator. Further still, a transceiver may comprise a multiplexer that receives a plurality of signals that are each separated in frequency by at least one octave.

An integrated transceiver may, in various embodiments, comprise a backward compatibility path for coupling the transceiver to a legacy device that is configured to operate in a different frequency band. An integrated transceiver may, further still, and in various embodiments, comprise an internal low-dropout regulator.

DETAILED DESCRIPTION

While various embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

In contrast to the described prior art, in various embodiments of the present invention, an integrated transceiver may be tuned to a plurality of independent bands, is locked to a stable oscillator that does not require tuning (i.e., a stable reference oscillator), features automatic digital gain control, modulates and demodulates a telemetry signal within the integrated transceiver, multiplexes a plurality of transmit and receive signals onto a single port in full-duplex mode, offers a separate receive path for backward compatibility with legacy modems, temperature compensates external circuitry in both the transmit and receive paths, and/or includes a injection switchable image reject mixer that is able to switch between a high side and a low side injection. The integrated transceiver achieves these and other goals by virtue of a detailed frequency plan. Thus, the frequency separations and specific operating frequencies identified hereinafter are important to the operation of the integrated transceiver. An integrated transceiver, may further, and in various embodiments, comprise a single integrated circuit or die.

Figure 1:
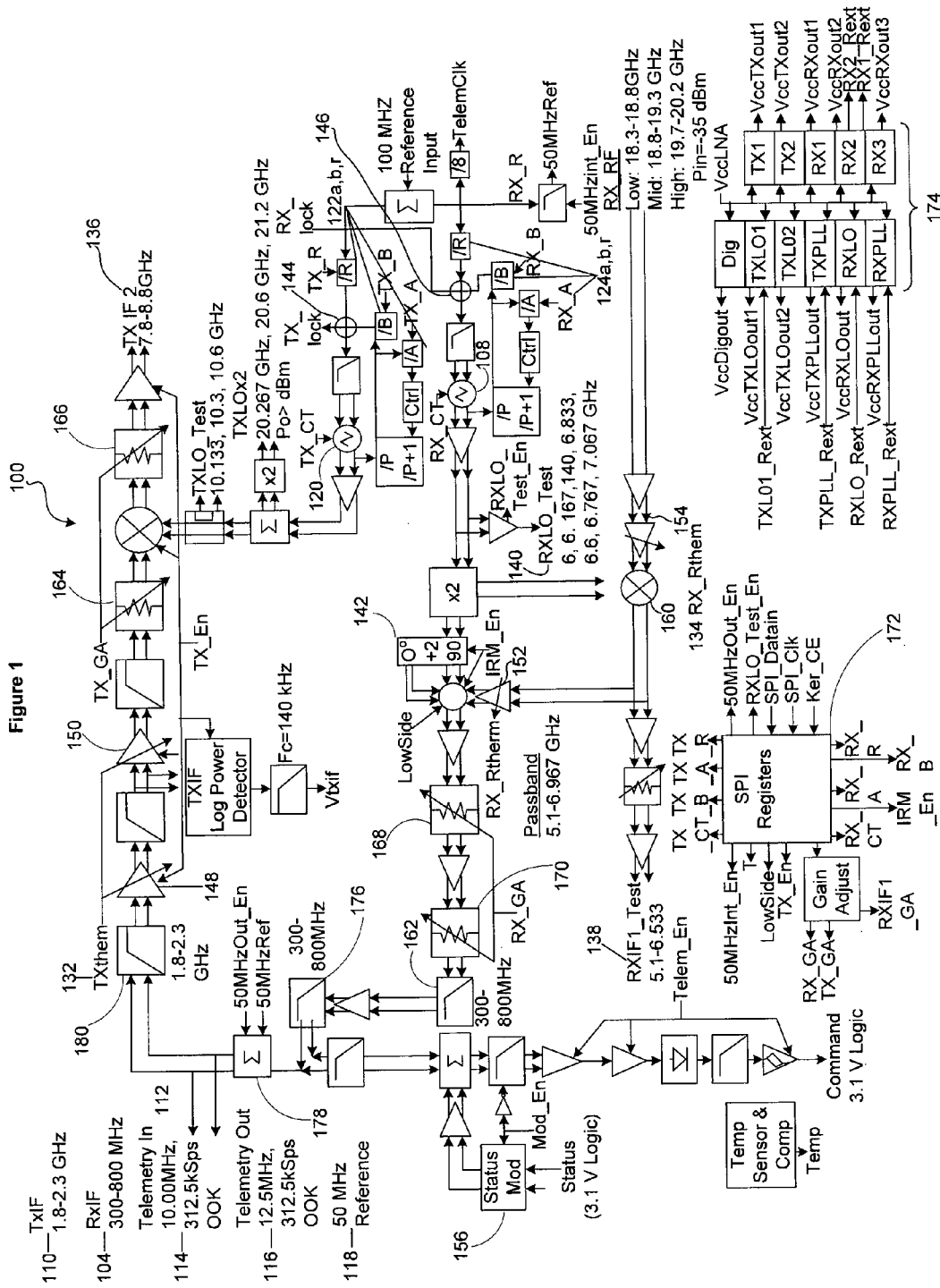
FIG. 1 shows a detailed block diagram of an example integrated transceiver system.
Figure 2:
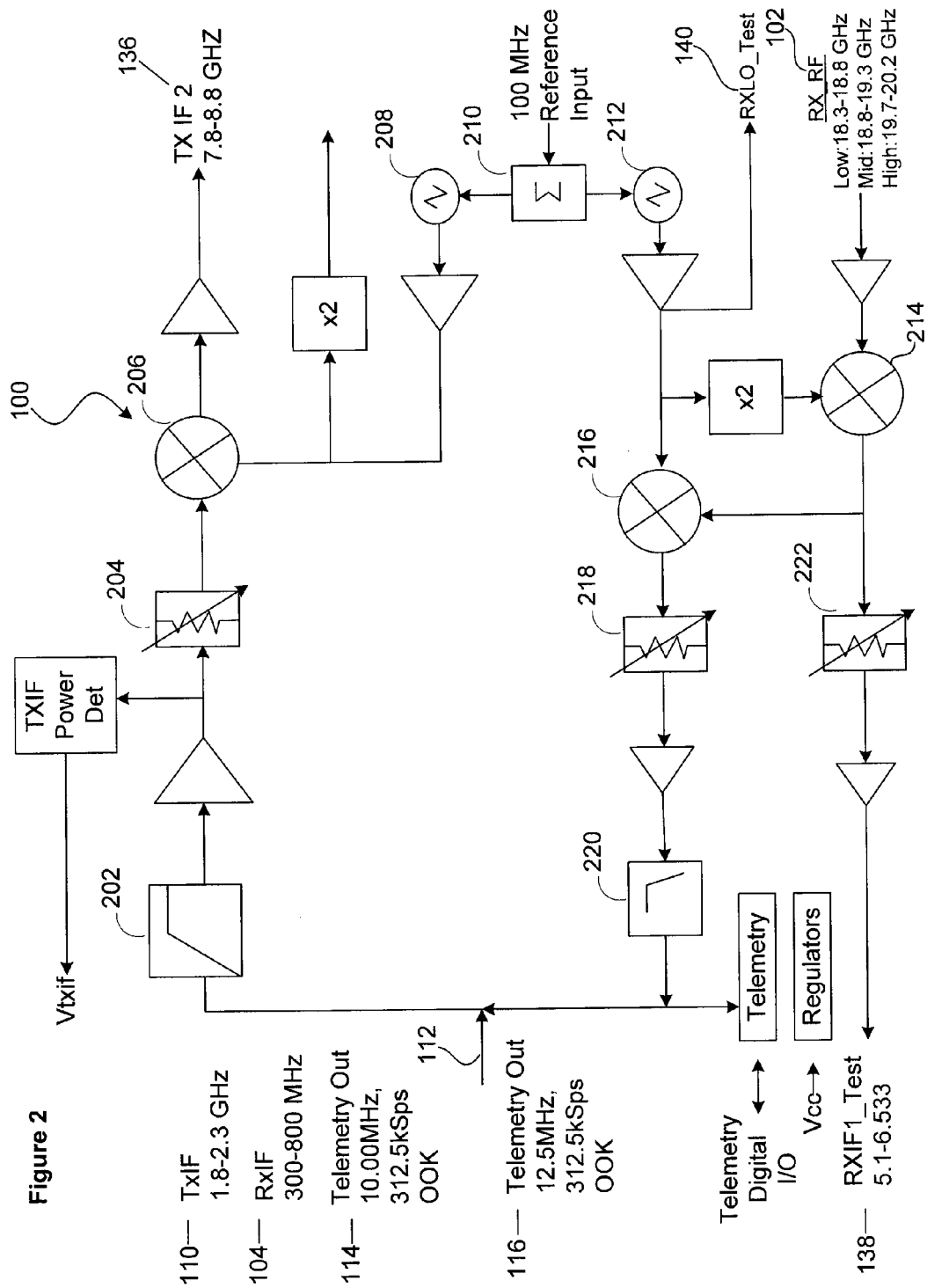
FIG. 2 shows a simplified block diagram of an example integrated transceiver system.
Figure 3:
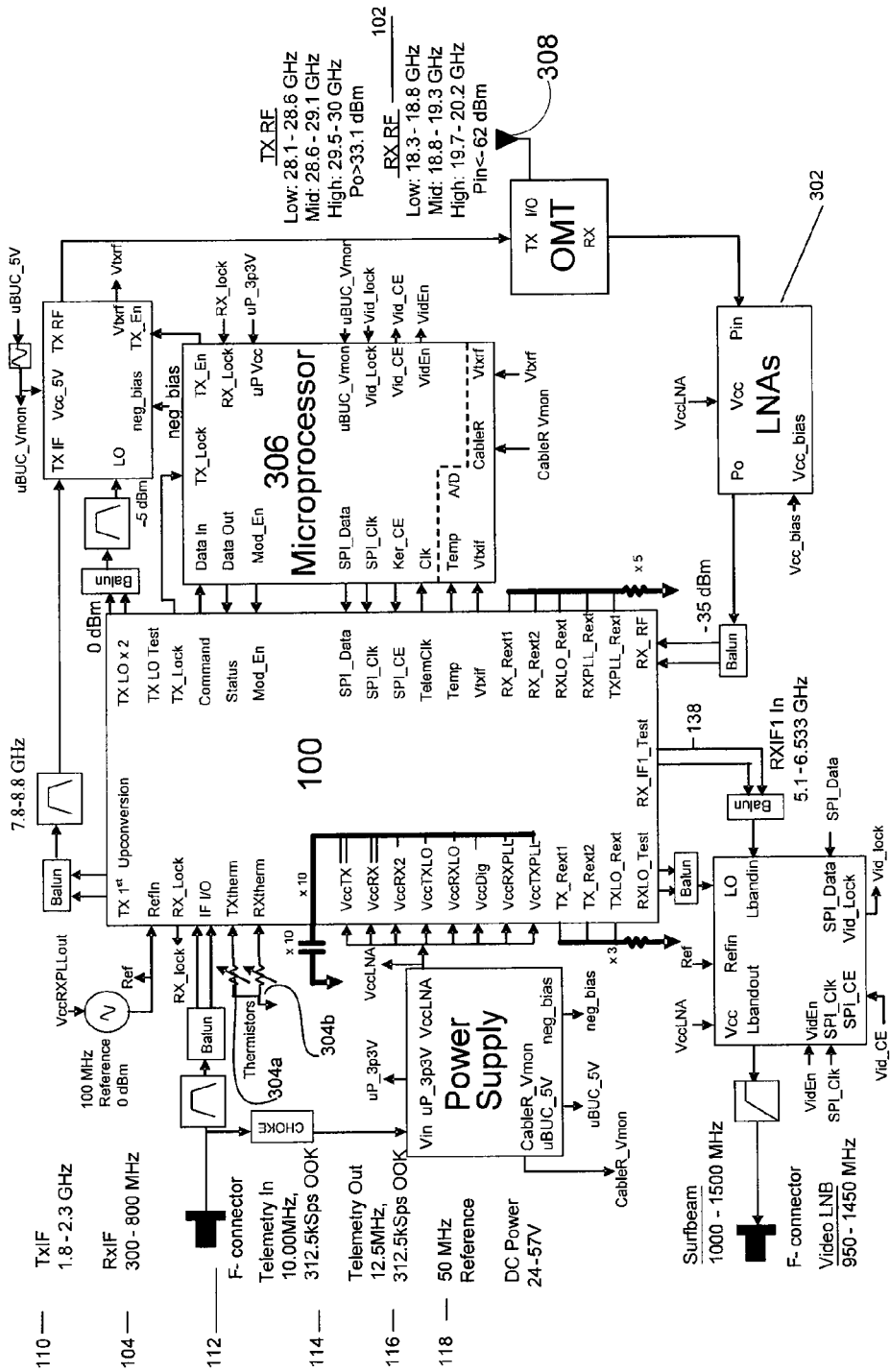
FIG. 3 shows a block diagram of an example integrated transceiver system.

In accordance with various embodiments and with reference to FIGS. 1, 2, and 3, several block diagrams showing an example embodiment of an integrated transceiver architecture 100 are provided. Integrated transceiver 100 may comprise an application specific integrated circuit ("ASIC") or a monolithic microwave integrated circuit ("MMIC"). Integrated transceiver 100 may further comprise a Silicon ("Si") or Silicon Germanium ("SiGe") substrate, or any other substrate that permits or may permit integration of microwave and digital components on a single chip. As described herein, an integrated transceiver 100 may comprise a single substrate or die.

In various embodiments, integrated transceiver 100 is configured to be much smaller than prior art transceivers of equal function. For example, integrated transceiver 100, in one example embodiment, is 1/120th the size of a non integrated transceiver of equal function, smaller by an order of magnitude of 100, and/or the like. Indeed, integrated transceiver 100 may fit on a chip that is approximately 0.1 in.$^2$ A similar prior art transceiver, on the other hand, would take up approximately 12 in.$^2$ of area on a circuit board.

In various embodiments, signals are communicated from one device to another on a MMIC using differential signaling. In some embodiments, differential signaling is used in only a portion of the MMIC. However, differential signaling may be used throughout the MMIC, or on a limited basis as desired. Note that differential signaling provides better noise immunity and isolation between critical signals. In accordance with various embodiments, the frequency plan is based on a determination of which signals should be differential and which signals should be single-ended.

With reference to FIGS. 1 and 2, integrated transceiver 100 may comprise a multiplexer (which may perform both multiplexing and demultiplexing operations). In various embodiments, the multiplexer may comprise a filter 162, a filter 176, a summer 178, and a filter 180. The multiplexer may communicate a variety of input and output signals over I/O port 112. For example, a variety of signals, including a receive ("RX") output 104, a telemetry input 114, a telemetry output 116, a transmit ("TX") IF input 110, and a reference oscillator 118 may be multiplexed onto I/O port 112. An RX output or signal 104 comprises, in various embodiments, a signal received from a satellite (and going to a modem). Likewise, a TX IF input or signal 110 comprises, in various embodiments, a signal received from a modem (and going to a satellite).

With further regard to signals 104 and 110, the TX IF input 110 is received from a modem (not shown) and may range, for example, from 1.8 GHz to 2.3 GHz. Similarly, the RX output 104 is transmitted to the modem and may range, for example, from 300 MHz to 800 MHz. The multiplexed frequencies are not limited to these values, but should be separated by at least 1 octave (max. low band frequency to min. high band frequency) to allow for adequate filtering. Thus, for example, in various embodiments, TX IF 110, which has a min. low band frequency of 1.8 GHz is separated by greater than an octave from RX IF 104, which has a max. high band frequency of 800 MHz.

In various embodiments, I/O port 112 may operate in a full-duplex mode, as signals 104, 110, 114, 116, and/or 118 may travel to and from the modem simultaneously. More particularly, and in various embodiments, signals 104, 110, 118 and one of 114 or 116 may be multiplexed simultaneously onto I/O port 112. That is, and in other words, Telemetry In 114 and Telemetry out 116 may be multiplexed onto port 112 in a half-duplex mode, while signals 104, 110 and 118 may be simultaneously multiplexed onto I/O port 112, together with one of signals 114 and 116, in a full-duplex mode. In various embodiments, and as describe herein, signals 104, 110, 114, 116, and/or 118 should be separated in frequency by at least one octave. If one or more signals 104, 110, 114, 116, and/or 118 are not separated by at least one octave, in various embodiments, it may be preferable to operate transceiver 100, with respect to signals which are not separated by at least one octave, in a single or half duplex mode.

Moreover, each signal 104, 110, 114, 116, and/or 118 may operate at a different frequency or in a different frequency range. Specifically, telemetry command input signal 114 may operate, for example, at approximately 10 MHz, while telemetry status output signal 116 may operate, for example, at approximately 12.5 MHz, and reference oscillator 118 may be clocked at approximately and, for example, 50 MHz. Further, and in various embodiments, signals 104, 110, 114, 116, and/or 118 are separated by frequency ranges sufficient to multiplex and/or filter each signal 104, 110, 114, 116, and 118 onto I/O port 112. Further still, and again in various embodiments, signals 104, 110, 114, 116, and/or 118 may be selected such that no signal 104, 110, 114, 116, and/or 118 comprises a low order harmonic multiple (e.g., less than eight) of any other frequency. This may minimize harmonic interference between signals 104, 110, 114, 116, and/or 118.

Thus, each of the five signals 104, 110, 114, 116, and 118 may be multiplexed onto I/O port 112 and full duplex operation between the modem and transceiver 100 achieved by virtue of the frequency margins that exist between each of the five signals. In other words, cross-talk or interference between each of the signals is at least minimized by the frequency separation of the TX and RX signals. Additional detail regarding full-duplex signal multiplexing is available in U.S. patent application Ser. No. 12/729,463, filed Mar. 23, 2010, which is hereby incorporated by reference. Notwithstanding, in some embodiments, half-duplex operation may be used.

With reference now to FIGS. 1, 2, and 3, a local oscillator RXLO 108 is provided for use with the portion of the integrated transceiver responsible for receiving communications ("receive portion") from an RF antenna 308. For example, RXLO 108 may be used to down-convert a received radio frequency ("RE") signal. Similarly, a local oscillator TXLO 120 is provided for use with the portion of the integrated transceiver responsible for transmitting communications ("transmit portion") to an RF antenna 308. For example, TXLO 120 may be used to up-convert an IF signal. Each reference oscillator 120 and 108 is independently tunable by way of counter registers 122 a, b, and r and 124 a, b and r, respectively. Each counter register may be loaded by way of a bus line, for example, a serial peripheral interface ("SPI") bus. In various embodiments, registers 122 a, b, and r and registers 124 a, b, and r are loaded by a single SPI bus.

More particularly, the output of RXLO reference oscillator 108 may be tuned by setting or programming the counter registers 124 a, b, and r. Phase detector 146 may be used to compare the reference input signal to the output signal and adjust the output signal to the desired frequency. On the transmit portion, a similar process may occur. Specifically, the output of TXLO reference oscillator 120 may be tuned by setting or programming the counter registers 122 a, b, and r. Phase detector 144 may be used to compare the reference input signal to the output signal and adjust the output signal to the desired frequency. Furthermore, any suitable devices and methods may be used for tuning RXLO and TXLO. Indeed, the transmit portion and receive portion are independently tunable. For instance, in various embodiments, the transmit portion and receive portion may be independently tuned to a variety of different frequencies.

That is, and for example, in various embodiments, the transmit and receive portions of integrated transceiver 100 may be independently tuned to a greater or fewer number of bands by varying the counter value of the 122 a, b, r and 124 a, b, r counters. In various embodiments, one or more individually tunable oscillators may be provided in accordance with the disclosure provided in co-pending U.S. application Ser. No. 12/614,293, filed Nov. 6, 2009, which is hereby incorporated by reference.

Thus, the present disclosure marks a significant improvement over prior art transceiver devices, which rely upon oscillators tuned to a single frequency. The present disclosure further improves on prior art devices, in that the one or more oscillators do not have to be tuned manually at the time of manufacture. Rather, each oscillator may be tuned and re-tuned automatically during operation.

With further regard to transmit and receive reference oscillators 120 and 108, in various embodiments, these are tuned far apart in frequency. That is, because the signals produced by each reference oscillator are produced at relatively high power, in various embodiments, it is important that each oscillator be tuned in a frequency range that is not too close to the operating frequency of the other reference oscillator. Otherwise, reference oscillators 120 and 108 might mix or interfere with each other and produce undesired, spurious products that will interfere with desired signals inside transceiver 100. Thus, for example, one of oscillators 120 and 108 may be tuned at a frequency that differs by a ratio of 2/3 from the frequency of the other oscillator.

Integrated transceiver 100 may further include, in various embodiments, automatic digital gain control. In various embodiments, this feature is implemented using automated test software and enables gain to be centered automatically, rapidly, and on the fly. Automated test software may be stored on-chip with integrated transceiver 100, for example, as part of an ASIC or FPGA, or it may be stored off-chip, in a connected component, such as, for example, a microprocessor 306 or other controller. In various embodiments, the gain may be independently adjusted both on the transmit portion as well as on the receive portion.

In various embodiments, integrated transceiver 100 is configured to automatically compensate for both internal and external temperature variations. These features may be understood with reference to FIGS. 1, 2, and 3. For example, integrated transceiver 100 may compensate both for temperature variations caused by its internal operations as well as for temperature variations caused by external components, such as, for example, off-chip amplifiers (e.g., LNA 302). Integrated transceiver 100 may also compensate for environmental temperature variations.

To compensate for internal and external temperature changes, in various embodiments, integrated transceiver 100 may sense an internal temperature using at least one temperature sensor 130. In various embodiments, if the internal temperature of the transceiver 100 is unsafe or exceeds a threshold, the digital gain of the transceiver 100 is adjusted. Specifically, the gain on one or more external amplifiers LNA 302 or another external power amplifier may be decreased or increased until the temperature sensor 130 detects a safe (or unsafe) operating temperature or until the operating temperature no longer exceeds a threshold. A signal gain may be adjusted, in various embodiments, by one or more digital attenuators 164, 166, 168, and/or 170, which may receive a control signal TX_GA and or RX_GA from a gain adjust module 172, which may respond to a control signal generated by a microprocessor 306 or an ASIC or FPGA. To this end, automatic digital gain control, as described herein, may be used to facilitate temperature control. Example temperature control systems are described in U.S. application Ser. No. 12/781,611, filed May 17, 2010, and U.S. application Ser. No. 13/109,838, filed May 17, 2011, which are hereby incorporated by reference.

In various embodiments, gain control may be achieved through the use of one or more temperature controlled resistors or thermistors that convert heat to resistance. In particular, transceiver 100 may include first and second variable gain amplifiers (VGAs) 148 and 150 that receive a signal TXtherm 132 from a thermistor 304*a*. Transceiver 100 may further include third and fourth VGAs 152 and 154 that receive a signal RXtherm 134 from a thermistor 304*b*. In various embodiments, first and second VGAs 148 and 150 reside on the transmit portion of the integrated transceiver 100, while third and fourth VGAs 152 and 154 reside on the receive portion of the integrated transceiver 100.

In general, as the temperature increases, the gain of an uncompensated amplifier tends to decrease. Conversely, as the temperature decreases, the gain tends to increase. To offset the gain change in these amplifiers, in various embodiments, temperature compensated VGAs are used that increase gain as temperature increases and decrease gain as temperature decreases. In various embodiments, the slope of the gain verses temperature profile of these VGAs is set to not only temperature compensate the gain of internal, uncompensated amps but also external uncompensated amps.

In various embodiments, VGAs 148 and 150 are coupled to thermistor 304*a*. In this way, as the temperature external to transceiver 100 increases, the resistance of thermistor 304*a* decreases. Thus, the current that sources the VGAs 148 and 150 is increased, which increases the gain of the transmit portion of transceiver 100. Correspondingly, the overall gain of transceiver 100 remains constant with temperature.

Likewise, in various embodiments, VGAs 152 and 154 are coupled to a receive signal, RX_Rtherm 134, from a thermistor 304*b*. As the temperature external to transceiver 100 increases, the resistance of thermistor 304*b* decreases. In turn, as the resistance of thermistor 304*b* decreases, the current that sources the receive VGAs 152 and 154 is increased, thereby increasing the gain of the receive portion.

Integrated transceiver 100 may, in various embodiments, include a modulator and demodulator Status Mod 156 for transmitting and receiving telemetry signals 114 and 116, respectively. In various embodiments, the modulator and demodulator Status Mod 156 is included on transceiver 100. In these embodiments, transceiver 100 may be manufactured on a SiGe substrate, which substrate accommodates both analog and digital circuitry in a single integrated circuit.

In various embodiments, integrated transceiver 100 may further comprise a backward compatibility path for coupling transceiver 100 to a legacy device (e.g., modem) that is configured to operate in a different frequency band (i.e., a band different from the output band associated with RXIF 104). The backward compatibility path leverages portions of vestigial testing circuitry left on integrated circuit 100 after the design process was completed, which would otherwise be wasted. Specifically, the backward compatibility path comprises RXIF1_Test 138 and RXLO_Test 140, so transceiver 100 may be coupled to a legacy device without the addition of other and/or additional components. The backward compatibility path is located on the integrated transceiver 100 chip mainly by virtue of the wide RXLO reference oscillator 108 tune range (from 5.5 GHz to 7.5 GHz in this example) as well as the carefully constructed frequency plan. In various embodiments, the backward compatibility path may accommodate both video and data channels.

Thus, transceiver 100 may comprise a MMIC having first and second I/O ports, wherein the first port 112 enables operation at a first frequency (e.g., 300-800 MHz) and the second port enables operation at a second backwards compatible frequency (e.g., 1000-1500 MHz). In operation, the first port 112 may communicate with a first modem, and the second port may communicate with a second modem. Stated another way, a transceiver may be configured to be compatible with two different modems each with a different receive frequency; wherein the transceiver uses input/output connections associated with the test signal paths for use as a receive path for one of the two modems. Thus, a single integrated transceiver may be backwards compatible with a legacy modem that operates and/or is configured to operate at a receive frequency (e.g., 1000-1500 MHz) that is different than a receive frequency (e.g., 300-800 MHz) associated with a more modern and/or sophisticated modem.

Integrated transceiver 100 may, in various embodiments, feature an injection switchable image reject mixer ("IRM") 142. Broadly, a simple IRM may be used with a mixer to reject the "image" or conjugate of the desired intermediate frequency ("IF") output signal from the mixer. An injection switchable IRM, then, may be used, in various embodiments, to selectively reject the "high side" or the "low side" of the IF output. Thus, in various embodiments, IRM 142 may selectively filter the desired image (high or low) of the down-converted IF output from mixer 160 for downstream processing in transceiver 100.

To clarify further, in various embodiments, instead of switching phase in the local oscillator path to the mixer, both the desired IF signal and the image IF signal are produced such that they are quadrature to one another in phase. A polyphase filter (not shown) following the mixer stages rejects one phase and passes the other. A switch (not shown) between the mixer stage and the polyphase filter allows the rejected phase signal to be switched between the two images. An example injection switchable IRM is illustrated in U.S. Pat. No. 6,952,572, which is hereby incorporated by reference, uses the more traditional injection switching method of switching the phase in the LO path instead of the IF path.

In various other embodiments, integrated transceiver 100 may include one or more internal low-dropout ("LDO") regulators 174. These regulators may provide very tightly regulated, clean supply voltages to the internal circuits which improve the phase noise, noise figure, and spurious performance over non-regulated alternatives. Further, multiple LDO regulators 174 may improve isolation between sections of circuitry in transceiver 100 (e.g., a transmit portion and a receive portion) that might otherwise be tied to a same power bus (i.e., because a variety of independent components, such as for example, local oscillator 108 and local oscillator 120 may be placed on separate, isolated, power busses).

With continuing reference to FIG. 2, a simplified block diagram of a transceiver 100 is shown. Although FIG. 2 does not show each component shown in FIG. 1, FIG. 2 may aid understanding, as it shows, notionally, how an integrated transceiver may be configured. To this end, an integrated transceiver 100 may operate in full-duplex mode and may comprise a transmit portion and a receive portion, as described herein, which may operate simultaneously. That is, transceiver 100 is configured to transmit and receive at the same time. In other words, the transmit portion and receive portion may each communicate a signal simultaneously. A transmit portion may process a transmit signal, while a receive portion may process a receive signal.

Thus, in various embodiments, a transmit portion of a transceiver 100 may comprise a filter 202 (e.g. a low pass or band pass filter), which may pass, for example, a range of frequencies associated with the TXIF signal 110 (e.g., 1.8-2.3 GHz). Filter 202 may be coupled to a digital attenuator 204 (through a buffer), which may operate as described above to regulate a gain associated with transceiver 100. Mixer 206 may, in various embodiments, receive an output of TXLO 208 (which may correspond, roughly, to TXLO 120 in FIG. 1). In various embodiments, mixer 206 generates an up-converted transmit signal TXIF2 136 based upon the signal generated by TXLO 208 and a transmit IF signal TXIF 110. A local oscillator TXLO 208 may, as described herein, generate an independently tunable signal. Further, an oscillator TXLO 208 may generate a signal in response to a received reference input signal (e.g., a 100 MHz reference signal), which may pass through a signal splitter 210 on its way to TXLO 208.

With reference now to an example embodiment, a receive portion of transceiver 100 may comprise a reference input signal (e.g., a 100 MHz reference input signal), which may pass through a signal splitter 210 in into a local oscillator RXLO 212 (which may correspond, roughly, to RXLO 108).

In various embodiments, and as described herein, RXLO 212 may generate a signal which a mixer 214 may mix with a receive signal RXRF 102 to generate a down-converted receive IF signal RXIF 104 (note that the signal path between oscillator 212 and mixer 214 is not shown in FIG. 2; note also that mixer 214 may correspond, roughly, to mixer 160). This down-converted receive IF signal RXIF 104 may, in various embodiments, be fed into an IRM 216 (which may correspond, roughly, to IRM 142). IRM 216 may select an image of signal 104, as described herein. The selected image of signal 104 may next pass through a digital attenuator 218, which may adjust a gain of signal 104, as described herein. Filter 220 may act as a band pass or high pass filter which may, for example, pass a frequency range of 300-800 MHz.

In various embodiments, the down-converted receive IF signal RXIF 104 generated by mixer 214 may pass through a digital attenuator 222, which may, as described herein, adjust a gain of the signal. In various embodiments, and as described herein, this signal may comprise a signal RXIF1_Test 138, which may be output at a frequency that a legacy device (e.g., an older modem) may use to interoperate with transceiver 100.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all of the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

Furthermore, while various components, features, and advantages have been described with reference to the integrated transceiver 100, various embodiments may include all or any combination of the components, features, and advantages described above.

The detailed description of various embodiments herein makes reference to the accompanying drawings and pictures, which show the various embodiments by way of illustration and its best mode. While these various embodiments are described in sufficient detail to enable those skilled in the art to practice the disclosure, it should be understood that other embodiments may be realized and that logical and mechanical changes may be made without departing from the spirit and scope of the disclosure. Thus, the detailed description herein is presented for purposes of illustration only and not of limitation. For example, the steps recited in any of the method or process descriptions may be executed in any order and are not limited to the order presented. Moreover, any of the functions or steps may be outsourced to or performed by one or more third parties. Furthermore, any reference to singular includes plural embodiments, and any reference to more than one component may include a singular embodiment.

Systems, methods and computer program products are provided. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. After reading the description, it will be apparent to one skilled in the relevant art(s) how to implement the disclosure in alternative embodiments.

What is claimed is:

1. An integrated full-duplex transceiver comprising:
    a single substrate comprising:
        an input/output ("I/O") port;
        a first mixer, electrically connected to the I/O port, for up-converting a transmit signal;
        a second mixer, electrically connected to the I/O port, for down-converting a receive signal, wherein the first mixer and the second mixer are configured to communicate the transmit and receive signals simultaneously over the I/O port in full-duplex communication;
        a first independently tunable local oscillator that drives the first mixer;
        a second independently tunable local oscillator that drives the second mixer;
    a multiplexer, electrically connected between the I/O port and the first and second mixers, wherein the multiplexer is configured to receive a plurality of signals;
    a variable gain amplifier ("VGA"), electrically connected to the first mixer, wherein a gain of the VGA depends upon a signal generated by at least one of a temperature controlled resistor and a thermistor;
    a gain adjust circuit on the substrate that adjusts a gain of at least one of: a digital attenuator on the transceiver and an off-chip amplifier in response to a reading provided by a temperature sensor;
    an injection switchable image-reject mixer ("IRM"), electrically connected to the second mixer, that filters a desired image of a received intermediate frequency ("IF") signal; and
    an internal low-dropout regulator electrically connected to the first and second independently tunable local oscillators.

2. The transceiver of claim 1, the substrate further comprising:
    a multiplexer that is electrically connected between the I/O port and the first and second mixers, wherein the multiplexer communicates a first signal and a second signal, wherein the first signal and the second signal are separated in frequency by at least one octave.

3. The transceiver of claim 2, wherein the first signal and the second signal are one of: a transmit intermediate frequency signal, a receive intermediate frequency signal, a telemetry in signal, a telemetry out signal, and a reference clock signal.

4. The transceiver of claim 1, wherein the first independently tunable local oscillator and the second independently tunable local oscillator are automatically re-tuned during operation.

5. The transceiver of claim 1, wherein the first independently tunable local oscillator and the second independently tunable local oscillator are independently tunable by way of a plurality of counter registers, each of which are loaded by way of a bus line and programmed using at least one counter register.

6. The transceiver of claim 1, wherein the first independently tunable local oscillator facilitates an up-conversion of the transmit signal and the second independently tunable local oscillator facilitates a down-conversion of the receive signal.

7. The transceiver of claim 1, the substrate further comprising a variable gain amplifier ("VGA"), electrically connected to the first mixer, wherein a gain of the VGA is adjusted in response to at least one of: a temperature external to the transceiver and a temperature internal to the transceiver.

8. The transceiver of claim 1, the substrate further comprising a gain adjust that adjusts a gain of at least one of: a digital attenuator on the transceiver and an off-chip amplifier in response to a reading provided by a temperature sensor.

9. The transceiver of claim 1, the substrate further comprising a signal path electrically connected through the second mixer that facilitates backwards compatibility with a legacy modem.

10. The transceiver of claim 1, the substrate further comprising an internal low-dropout regulator electrically connected to the first and second independently tunable local oscillators.

11. The transceiver of claim 1, the substrate further comprising a first plurality of programmable registers for tuning the first independently tunable local oscillator and a second plurality of programmable registers for tuning the second independently tunable local oscillator.

12. The transceiver of claim 1, the substrate further comprising an injection switchable image reject mixer ("IRM"), electrically connected to the second mixer, that filters a desired image of a received intermediate frequency ("IF") signal and configured to switch from at least one of a high side injection to a low side injection and a low side injection to a high side injection.

13. The transceiver of claim 1, the substrate further comprising a variable gain amplifier ("VGA"), wherein a gain of the VGA depends upon a signal generated by at least one of a temperature controlled resistor and a thermistor.

14. An integrated full-duplex transceiver comprising:
    a single substrate comprising:
        an input/output ("I/O") port;

a first mixer, electrically connected to the I/O Port, for up-converting a transmit signal;

a second mixer, electrically connected to the I/O port, for down-converting a receive signal, wherein the first mixer and the second mixer are configured to communicate the transmit and receive signals simultaneously over the I/O port in full-duplex communication;

a first means for independently tuning a first independently tunable local oscillator that drives the first mixer;

a second means for independently tuning a second independently tunable local oscillator that drives the second mixer;

a multiplexer, electrically connected between the I/O port and the first and second mixers, wherein the multiplexer is configured to receive a plurality of signals;

a variable gain amplifier ("VGA"), electrically connected to the first mixer, wherein a gain of the VGA depends upon a signal generated by at least one of a temperature controlled resistor and a thermistor;

a gain adjust circuit on the substrate that adjusts a gain of at least one of: a digital attenuator on the transceiver and an off-chip amplifier in response to a reading provided by a temperature sensor;

an injection switchable image reject mixer ("IRM"), electrically connected to the second mixer, that filters a desired image of a received intermediate frequency ("IF") signal and configured to switch from at least one of: a high side injection to a low side injection and a low side injection to a high side injection; and an internal low-dropout regulator electrically connected to the first and second independently tunable local oscillators.

15. The transceiver of claim 14, wherein the first independently tunable local oscillator and the second independently tunable local oscillator are automatically re-tuned during operation.

16. The transceiver of claim 14, the substrate further comprising a gain adjust that adjusts a gain of at least one of: a digital attenuator on the transceiver and an off-chip amplifier in response to a reading provided by a temperature sensor.

17. The transceiver of claim 14, the substrate further comprising a signal path, electrically connected through the second mixer that facilitates backwards compatibility with a legacy modem.

18. The transceiver of claim 14, the substrate further comprising a variable gain amplifier ("VGA"), wherein a gain of the VGA depends upon a signal generated by at least one of a temperature controlled resistor and a thermistor.

* * * * *